United States Patent
Losavio

(10) Patent No.: US 6,225,231 B1
(45) Date of Patent: May 1, 2001

(54) RECOVERY OF DAMAGES IN A FIELD OXIDE CAUSED BY HIGH ENERGY ION IMPLANT PROCESS

(75) Inventor: Aldo Losavio, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/324,562

(22) Filed: Jun. 3, 1999

(30) Foreign Application Priority Data

Jun. 5, 1998 (IT) .............................. VA98A0012

(51) Int. Cl.⁷ .................. H01L 21/302; H01L 21/336
(52) U.S. Cl. .................. 438/705; 438/706; 438/714; 438/305
(58) Field of Search .................. 438/400, 705, 438/706, 690, 714, 197, 305, 424, 435

(56) References Cited

U.S. PATENT DOCUMENTS

| | | | |
|---|---|---|---|
| 4,446,373 | * 5/1984 | Denholm et al. | 250/492.2 |
| 4,472,212 | * 9/1984 | Kinsborn | 148/188 |
| 5,013,675 | * 5/1991 | Shen et al. | 437/44 |
| 5,573,963 | * 11/1996 | Sung | 437/34 |
| 5,589,407 | * 12/1996 | Meyyappan et al. | 437/26 |
| 5,620,526 | * 4/1997 | Watatani et al. | 134/1.1 |
| 5,759,901 | * 6/1998 | Loh et al. | 438/305 |
| 5,808,331 | * 8/1998 | Zhang et al. | 257/254 |
| 5,985,735 | * 11/1999 | Moon et al. | 438/435 |
| 6,017,784 | * 1/2000 | Ohta et al. | 438/197 |
| 6,043,136 | * 3/2000 | Jang et al. | 438/424 |
| 6,120,597 | * 9/2000 | Ievy et al. | 117/3 |

* cited by examiner

*Primary Examiner*—John F. Niebling
*Assistant Examiner*—Viktor Simkovic
(74) *Attorney, Agent, or Firm*—Theodore E. Galanthay; Allen, Dyer, Doppelt, Milbrath & Gilchrist, P.A.

(57) ABSTRACT

A method for recovering the original properties of a silicon oxide film that has suffered a high energy implantation of dopants in the underlying silicon substrate, includes a brief heat treatment without causing an excessive lateral diffusion in the silicon substrate of the implanted dopants. Heat treating in an oven at a temperature of 800° C. for few minutes per wafer, which was subjected to high energy implantation, makes it possible to recover etch rate characteristics that are practically similar to those of the original non-implanted silicon oxide.

11 Claims, 6 Drawing Sheets

DIFFUSED REGION AFTER HEAT TREATMENT

SELECTIVE GROWTH OF FIELD OXIDE STRUCTURE

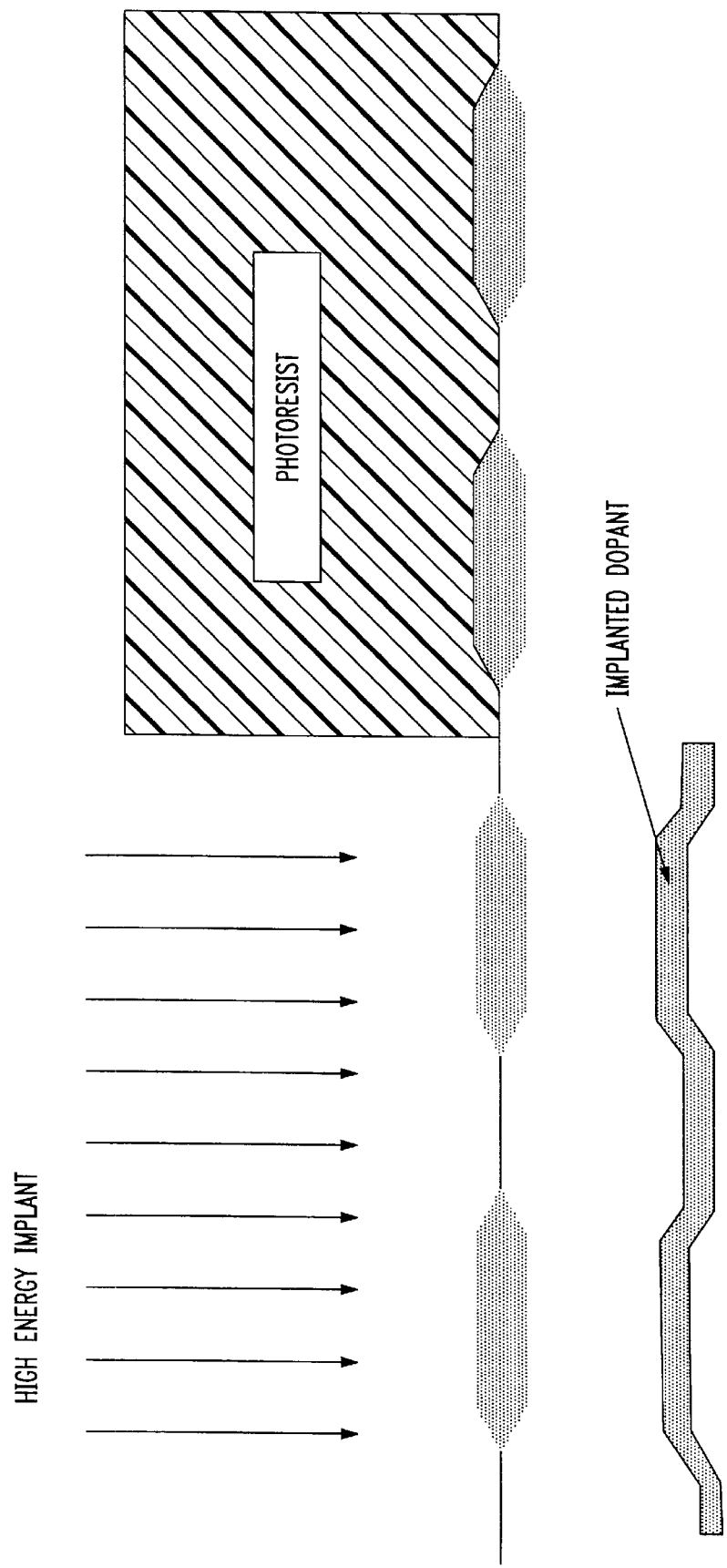

RECOVERY OF DAMAGES IN A FIELD OXIDE CAUSED BY HIGH ENERGY ION IMPLANT PROCESS

FIELD OF THE INVENTION

The invention relates to ULSI fabrication of integrated devices, and more particularly, to the recovery of the original properties of a silicon oxide film that has suffered a high energy implantation of dopants in the underlying silicon substrate.

BACKGROUND OF THE INVENTION

In ULSI fabrication processes of electronic devices (technological processes whose minimum planar definition width is less than 0.5 μm), containment of the lateral dimensions of the features that define the various integrated structures becomes more and more complex and difficult to obtain though even more important to guarantee. To achieve this, there is a need for the ability to maintain an adequate electrical insulation between two adjacent elements in the device layout. The electrical insulation substantially depends on two factors:

1) The selective growth/deposition of an oxide (for example, the LOCOS technique), able to define adjacent areas on the silicon, separated by a field oxide, where the integrated structures of distinct active circuit elements, e.g. transistors, memory cells, etc., will be formed; and 2) The doping processes of active areas of the silicon semiconductor substrate, applied via ion implantation, to form insulating junctions electrically decoupling adjacent circuit elements even in the presence of strong bias voltages.

In conventional fabrication processes (minimum planar definition width >0.5 μm), the doping process occurs by relatively low kinetic energy ion implantation (ion acceleration energies lower than 200 keV). Accordingly, the doping agents (commonly boron, phosphorus and arsenic in doses of about $10^{12}$ atom/cm$^2$ and $5 \times 10^{13}$ atom/cm$^2$) are implanted just below the surface of the silicon substrate to a depth of few tenths of millimeters. Therefore, the formation of well regions occurs through relatively long thermal diffusion treatments in an oven at temperatures ranging between 900° C. to 1200° C. for 60 to 600 minutes.

This long thermal treatment may cause the diffusion of superficially implanted dopants around the implanted zone. FIGS. 1A and 1B depict this traditional process. In order to obtain a greater planar density of the circuit elements, such a process cannot be used because the long heat treatments required to diffuse the dopants to a sufficient depth also cause an intolerable lateral diffusion of dopants.

To limit such lateral diffusion of dopants, a high-energy ion implantation technique (implantation energies of 200 keV to 3000 keV) is used which permits implantation of dopant atoms at a desired depth. With this technique, it is possible to implant the same doping agents (boron, phosphorous and arsenic) in the same doses ($10^{12}$/cm$^2$ and $5 \times 10^{13}$/cm$^2$) employing acceleration energies that may be varied generally between 200 keV and 3000 keV. Thus, it is possible to avoid and totally eliminate the long thermal treatments that were needed to diffuse the dopants according to the conventional process.

These high-energy implantations are usually accomplished after defining the active areas, that is, after the growth/deposition of the field oxide over the separation zones among adjacent active areas on the surface of the semiconductor silicon wafer. The typical range of depth of implantation of dopant atoms into the silicon according to these high-energy processes is between 0.5 μm and 4 μm. According to these techniques, it is therefore inevitable that the accelerated ions cross regions covered with the field oxide, usually SiO$_2$, whose thickness may range between 0.3 μm and 0.7 μm.

During the implantation process, the high-energy ions undergo collisions that slow down their speed when crossing the field oxide. The causes of this slowing down are substantially the following:

1) a scattering phenomena with the nuclei of the atoms of the field oxide (nuclear scattering); and 2) a scattering phenomena with the electrons of the atoms of the field oxide (electronic scattering).

Under typical implantation conditions, only electronic scattering is active in the slowing down of the ions being implanted. Electronic scattering damages the oxide by causing the breaking of Si-O-Si chemical bonds. This type of damage had never been noticed in CMOS fabrication processes until the advent of the high-energy implantation technique. Also, this damage makes the oxide more sensitive to the wet and dry etching treatments that are normally performed after implanting dopants according to normal fabrication processing.

In particular, there are certain high energy ion implantation conditions, for example phosphorus implanted at energies higher than 2000 keV, in doses larger than $5 \times 10^{12}$ atoms/cm$^2$, according to a well known "triple well" fabrication process, which induce a remarkable increment of the oxide etch rate of about 200% as compared to a non-implanted oxide (=100%). In other words, the etch sensitivity of the oxide may double. Moreover, since these high energy implants are normally done through the apertures of photoresist masks, to allow for a selective doping of certain active areas of the device, the field oxide of the regions exposed to implantation will become more sensitive to etching than in nonexposed (masked) regions. When carrying out successive wet and/or dry etchings, as normally envisaged in a typical CMOS fabrication process, the field oxide over implanted regions will be overetched compared to the field oxide over non-implanted regions.

Another consequence is an excessive broadening of active areas delimited by the edges of the field oxide, which is accentuated by the isotropicity of wet etchings, that tend to "wear out" the often acute corners, of the field oxide edges. The result is that, in the oxide regions damaged by the ion implantation, the active areas will become wider than the design width and active areas will be closer (due to the reduction of the planar width of the field oxide). Moreover, the field oxide thickness will be reduced by the overetch effect, as illustrated in FIGS. 2A–2C. All these effects reduce isolation of the field oxide; thereby, making it inadequate.

SUMMARY OF THE INVENTION

It has now been found that it is possible to recover the original properties of a silicon oxide film that has suffered a high energy implantation of dopants in the underlying silicon substrate, or at least to effectively prevent the insurgence of the above noted problems, in an ULSI fabrication process of integrated devices. Preliminary tests conducted on representative samples have confirmed the potential to recover the damages caused by high energy ion bombardment in a layer of silicon oxide of a field oxide structure through a brief heat treatment without causing an excessive lateral diffusion in the silicon substrate of the implanted dopants.

It has been found that by heat treating in an oven at a temperature of 800° C. for few minutes per wafer, subjected to high energy implantation, it is possible to recover etch rate characteristics that are practically similar to those of the original non-implanted silicon oxide. Moreover, this can be done without causing an appreciable lateral diffusion of the dopants implanted in the silicon substrate.

BRIEF DESCRIPTION OF THE DRAWINGS

FIGS. 2A, 2B and 2C illustrate certain steps of a conventional CMOS fabrication process that utilizes a high-energy ion implantation as in the prior art.

DETAILED DESCRIPTION OF THE PREFERRED EMBODIMENTS

Figure 1A:
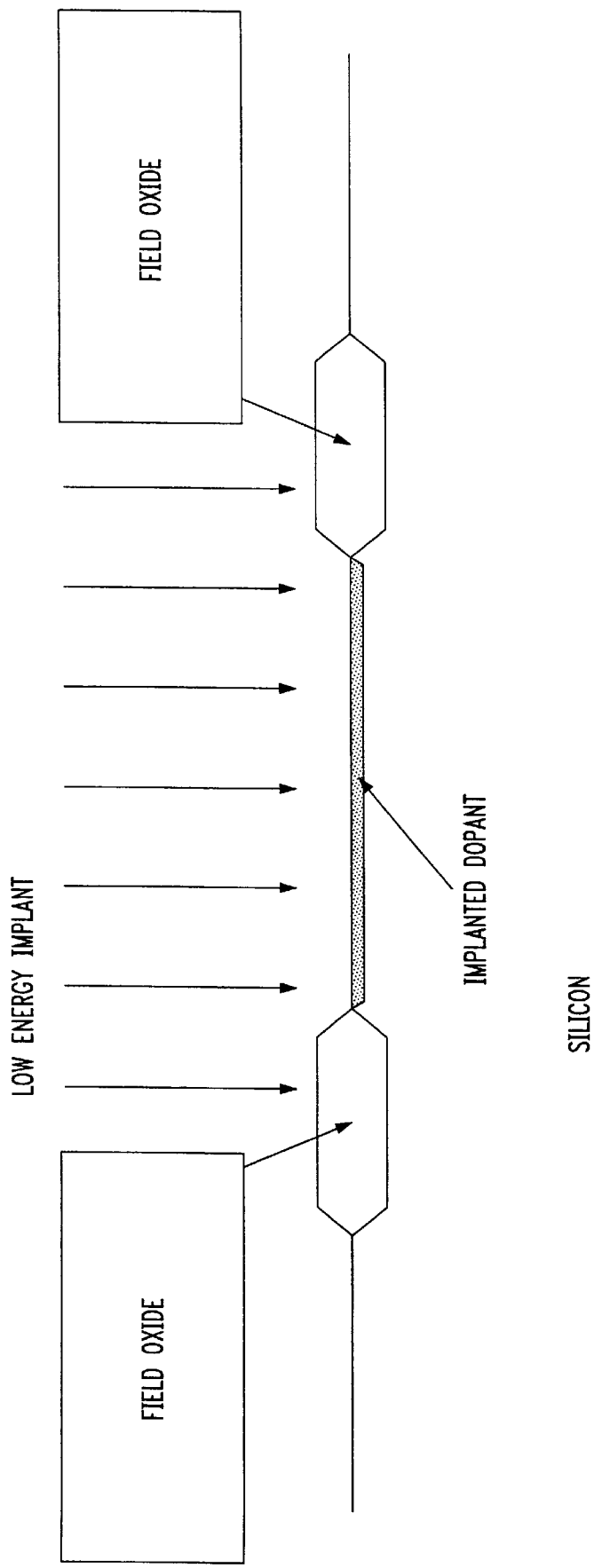
FIGS. 1A and 1B illustrate the prevailing phases of the conventional low energy ion implantation and the successive diffusion as in the prior art.
Figure 1B:
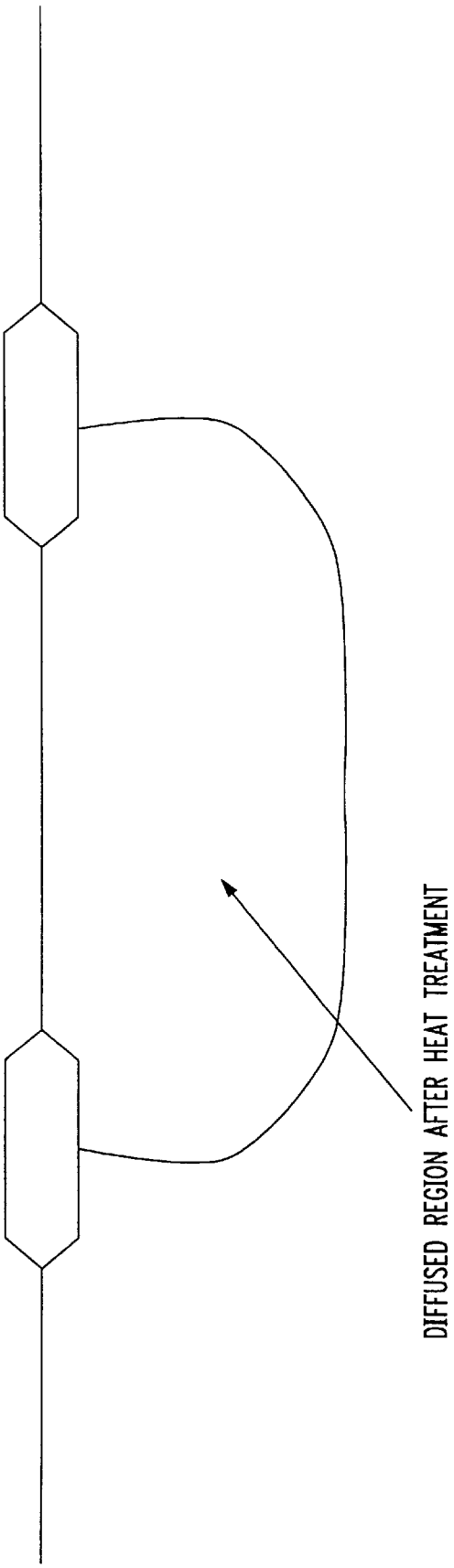
Figure 2A:
Figure 2C:
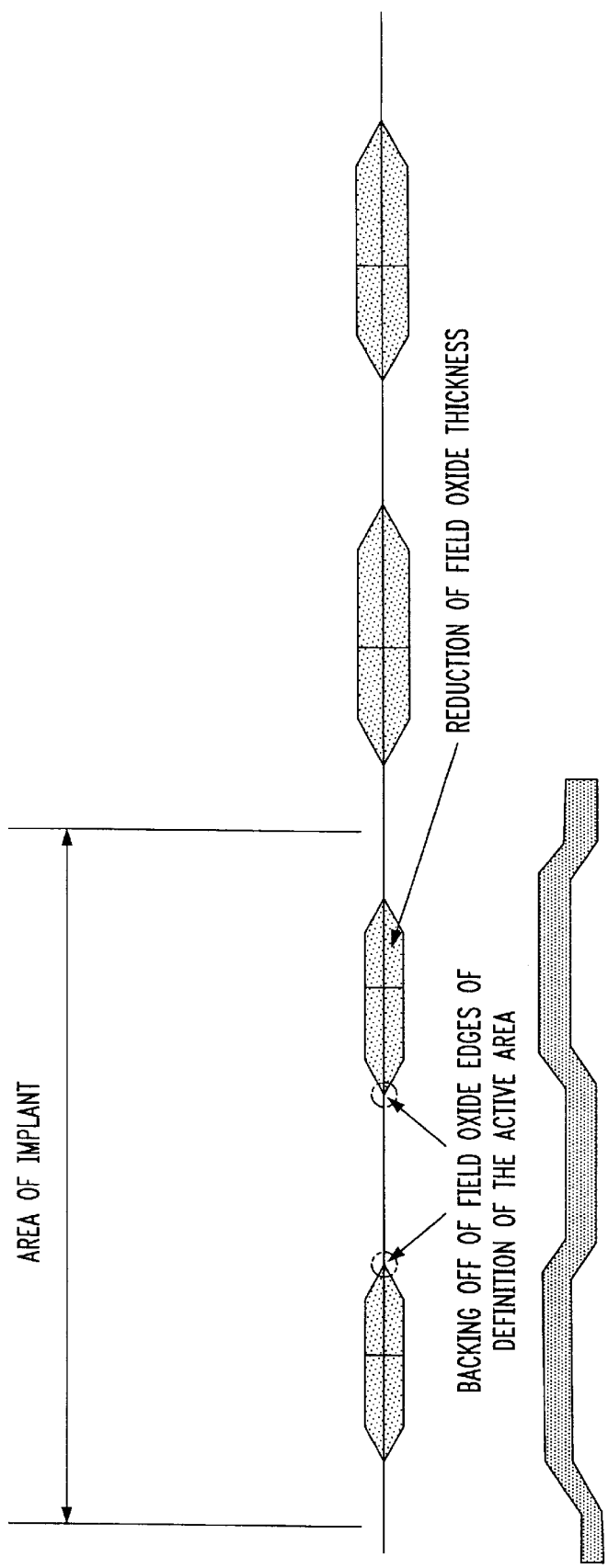
Figure 3:
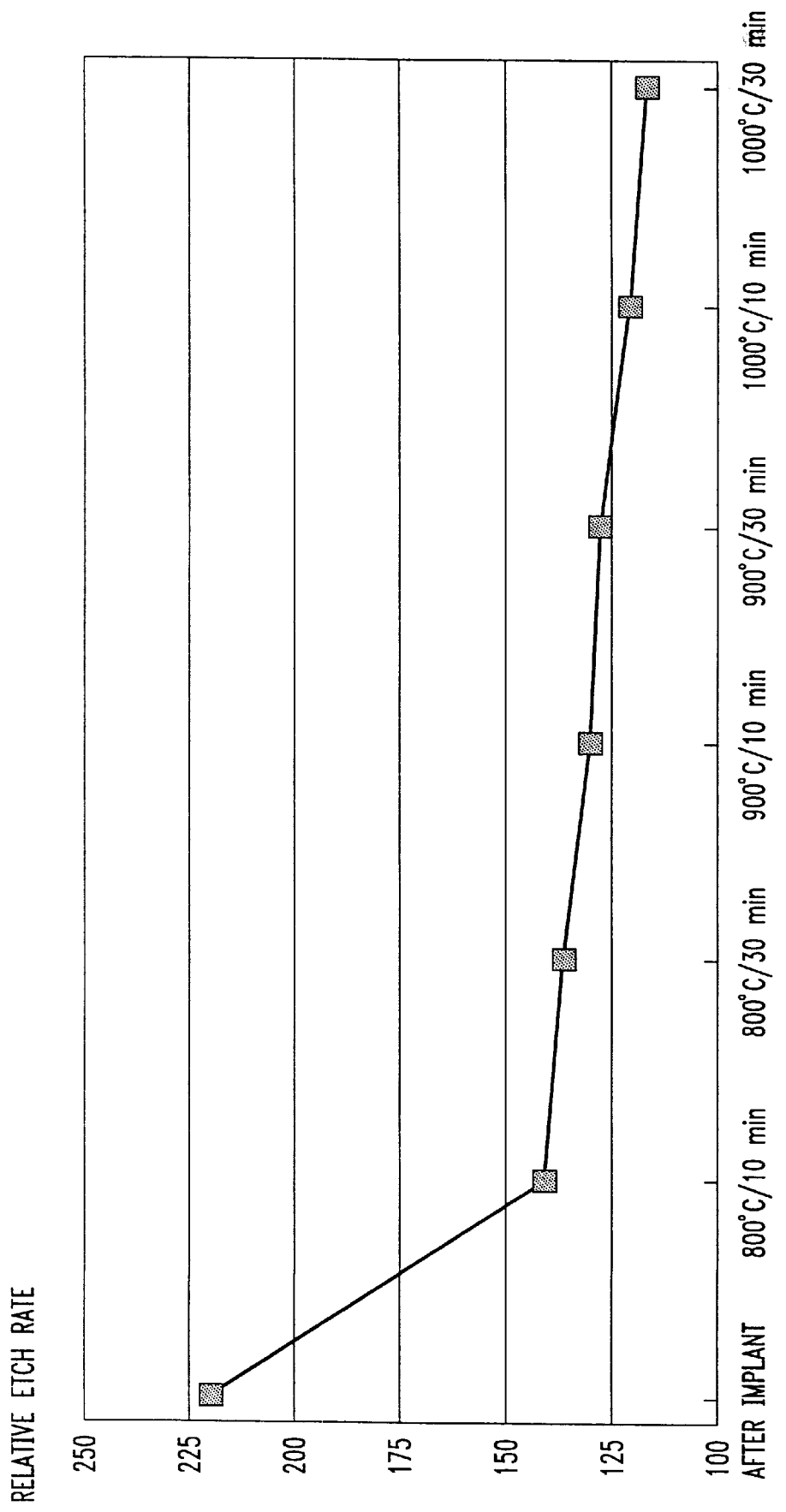
FIG. 3 is a diagram showing the recovery of the silicon oxide etch properties according to the present invention.

Referring to FIG. 3, while annealing at a temperature of 800° C., in terms of recovering a field oxide etch rate not greater than about 30% of the etch rate of a non-implanted oxide, a substantial recovery of the etch characteristics of the field oxide damaged by high energy ion implantation may be obtained with a treatment of about 10 minutes. The same result may be achieved in a shorter time by heating at higher temperatures, for example at 900° C. and at 1000° C. At 1000° C., the time of treatment may be about 5 minutes.

In all cases there exists a damage recovery (in terms of a reduction of the etch rate that the high energy implantation process may have doubled) which initially is quite rapid, to recover an etch rate of silicon oxide not greater than 30% of a non-implanted oxide, during a first period which may be 5 to 10 minutes depending on the treatment temperature. Thereafter, further reduction of the etch rate with respect to time becomes less and less pronounced. This reduction drops (for a temperature of 1000° C.) to a value not higher than 20% of the etch rate of the non-implanted oxide after 30 minutes.

EXAMPLES

In the test mode, the silicon oxide of the field oxide structure had a thickness of 0.4 $\mu$m and was exposed to phosphorus implantation with energies from 2000 keV up to 3 MeV and with doses ranging between 2 and $5\times10^{13}$ atoms/cm$^2$. The implantation determined an increase of the etch rate of 220% over the etch rate of a same non-implanted oxide considered equal to 100%. By the heat treatment of the invention, it was possible in all cases to verify the recovery of an oxide etch rate not greater than 30% of the etch rate of the non-implanted oxide (that is, about 130%) after a treatment not longer than 10 minutes.

Comparative tests carried out by changing the heat treatment atmosphere, alternatively using a nitrogen atmosphere, an oxygen atmosphere and an atmosphere of a mixture of nitrogen-oxygen, have demonstrated that the recovery from the damage caused by the ion bombardment is not significantly altered by the nature of the atmosphere but rather, and markedly, by the treatment temperature. The particular exponential characteristic of the recovery process, indicates a substantial compatibility of such an annealing treatment of the field oxide, to substantially recover the original etch rate after having being subject to a high-energy implantation. This is done with the requisite of averting an excessive lateral diffusion of implanted dopants and therefore is suitable to any CMOS fabrication processes (for example RAM, EPROM, EEPROM, FLASH and logic circuits), characterized by the "triple well" process. In any case, it is suitable for any fabrication process using high energy ion implantation, above 1 MeV, through the layers of silicon oxide which would suffer from overetch during successive etching steps of the fabrication process.

That which is claimed is:

1. A method for fabricating semiconductor devices comprising the steps of:

growing or depositing a silicon oxide layer on a semiconductive silicon wafer;

implanting high-energy ion dopants to a predetermined depth in the semiconductive silicon wafer through the silicon oxide layer;

annealing, at a temperature not less than 800° C. and for a time not less than five minutes, the silicon oxide layer after having been subjected to the high-energy ion implantation and before undergoing etching, until recovering an etch rate of the silicon oxide layer which is less than or equal to %130 of the etch rate of a non-implanted silicon oxide layer;

depositing layers over the silicon oxide layer; and successive dry and/or wet etching of the layers deposited on the silicon oxide layer.

2. A method according to claim 1, wherein the step of successive dry and/or wet etching of layers further comprises etching regions of the silicon oxide layer.

3. A method according to claim 1, wherein the step of annealing comprises annealing at approximately 1000° C. for at least thirty minutes until an etch rate of the silicon oxide layer, which is less than or equal to %120 of the etch rate of a non-implanted silicon oxide layer, is recovered.

4. A method for fabricating a semiconductor device comprising the steps of:

forming an oxide layer on a semiconductive wafer;

implanting dopants with high-energy ions through the oxide layer;

annealing the oxide layer, at a temperature equal to or greater than 800° C. and for a time equal to or greater than five minutes and until an etch rate of the oxide layer, which is less than or equal to 130% of the etch rate of a non-implanted oxide layer, is recovered.

5. A method according to claim 4, further comprising the steps of:

depositing layers over the oxide layer; and successive dry and/or wet etching of the deposited layers.

6. A method according to claim 5, wherein the step of successive dry and/or wet etching of layers further comprises etching regions of the oxide layer.

7. A method according to claim 4, wherein the oxide layer is annealed at approximately 1000° C. for at least thirty minutes until an etch rate of the oxide layer, which is less than or equal to 120% of the etch rate of a non-implanted oxide layer, is recovered.

8. A method for fabricating a semiconductor device comprising the steps of:

forming an oxide layer on a semiconductive wafer;

implanting dopants with high-energy ions through the oxide layer;

annealing the oxide layer until an etch rate of the oxide layer, which is less than or equal to %130 of the etch rate of a non-implanted oxide layer, is recovered.

9. A method according to claim 8, further comprising the steps of:

depositing layers over the oxide layer; and successive dry and/or wet etching of the deposited layers.

10. A method according to claim 9, wherein the step of successive dry and/or wet etching of layers further comprises etching regions of the oxide layer.

11. A method according to claim 8, wherein the oxide layer is annealed until an etch rate of the oxide layer, which is less than or equal to %120 of the etch rate of a non-implanted oxide layer, is recovered.

* * * * *